(12) United States Patent
Kuan (10) Patent No.: US 8,295,580 B2
(45) Date of Patent: Oct. 23, 2012

(54) SUBSTRATE AND DIE DEFECT INSPECTION METHOD

(75) Inventor: Chiyan Kuan, Danville, CA (US)

(73) Assignee: Hermes Microvision Inc., Hsin-Chu (TW)

( * ) Notice: Subject to any disclaimer, the term of this patent is extended or adjusted under 35 U.S.C. 154(b) by 592 days.

(21) Appl. No.: 12/553,072

(22) Filed: Sep. 2, 2009

(65) Prior Publication Data

US 2011/0052040 A1   Mar. 3, 2011

(51) Int. Cl.
*G06K 9/00*   (2006.01)
(52) U.S. Cl. ........................................................ 382/141
(58) Field of Classification Search .................. 382/141, 382/144, 145
See application file for complete search history.

(56) References Cited

U.S. PATENT DOCUMENTS 7,848,563 B2 *  12/2010  Sakai et al. ................... 382/149
2008/0063258 A1 *  3/2008  Kimba .......................... 382/149

* cited by examiner

*Primary Examiner* — Roy M Punnoose
(74) *Attorney, Agent, or Firm* — Stout, Uxa, Buyan & Mullins, LLP (57) ABSTRACT

A substrate inspection method is disclosed. The disclosed method includes 1) providing one or more images of one or more sample substrates; 2) identifying, from the images, two or more occurrences of a target pattern in the images; and 3) comparing the identified target-pattern occurrences against each other to determine, from the images, a presence of abnormalities in the compared target-pattern occurrences, hence determining one or more defects physically present in the target-pattern occurrences. The disclosed method may be implemented via execution of a computer program encoded in a computer readable medium, where the computer program instructs an imaging apparatus to form images of the of-interest sample substrates and instructs an image analyzing apparatus to identify and compare, from the images, the target-pattern occurrences on the sample substrates.

20 Claims, 12 Drawing Sheets

SUBSTRATE AND DIE DEFECT INSPECTION METHOD

FIELD OF THE INVENTION

The present invention is generally related to substrate inspection, and more particularly to a method for inspecting a semiconductor substrate with an irregularly distributed repetitive pattern and/or a non-repetitive pattern thereon.

BACKGROUND OF THE INVENTION

Semiconductor devices are generally produced from patterned substrates. Multiple dies are formed on a substrate, where each of the dies comprises feature patterns (such as contact holes, metal lines, etc.) formed in designated layouts. Semiconductor devices with desired functions are eventually formed from these dies or formed by using these dies as a template. The substrate may be a wafer or a mask.

As used herein, the term "pattern" will be used to refer to one or a group of specific feature patterns formed in a certain layout. Within one die, for example, a pattern may be formed in repeating periods, wherein each of the repeating periods has an identical pattern i.e. a set of identical feature patterns in the same layout. For patterns on a certain die of interest, the repeating period may be greater than or equal to one. As used herein, patterns formed in a repeating period greater than one, for example equal to or greater than two within the die, will be referred to as a repetitive pattern. On the other hand, patterns which are formed in a repeating period equal to one within the die will be referred to as a non-repetitive pattern.

Figure 1:
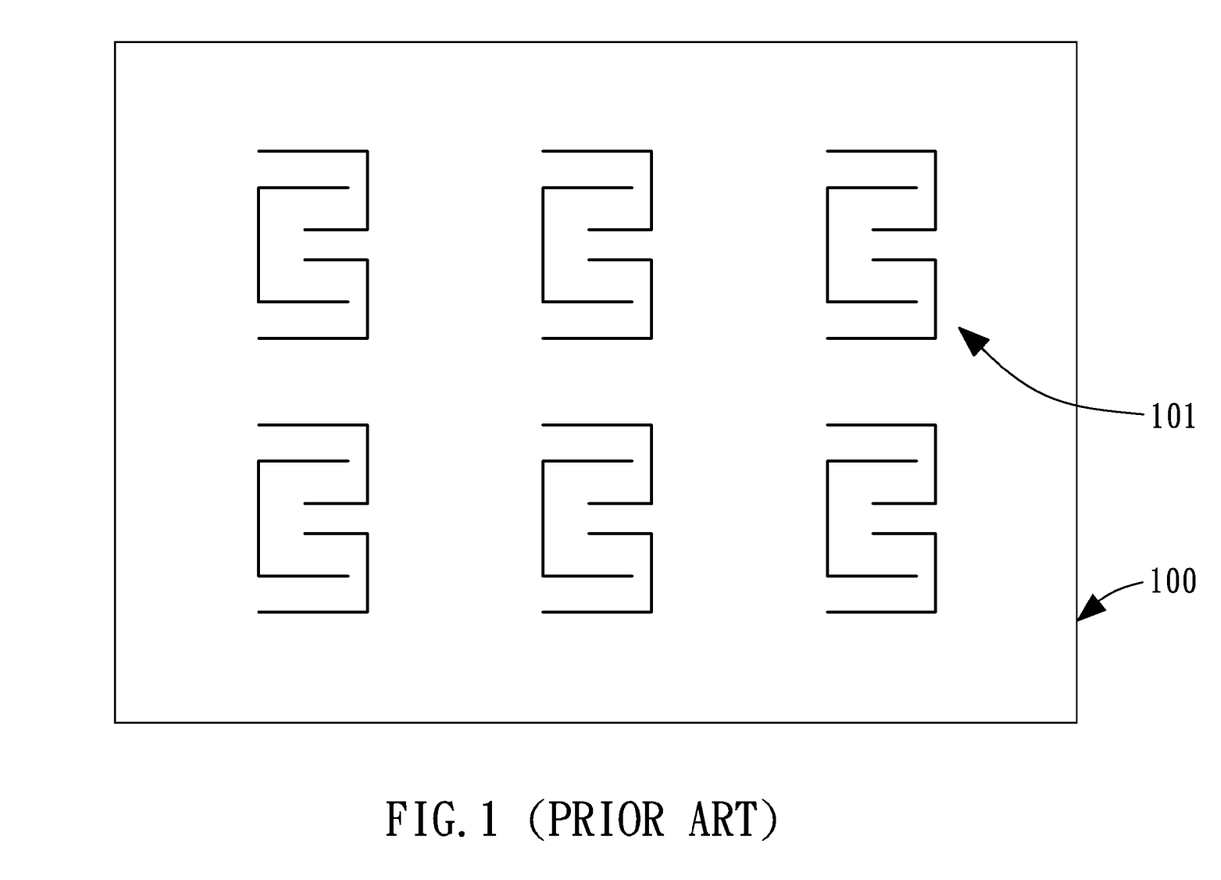
FIG. 1 is a schematic illustration of a regularly distributed repetitive pattern.
Figure 2:
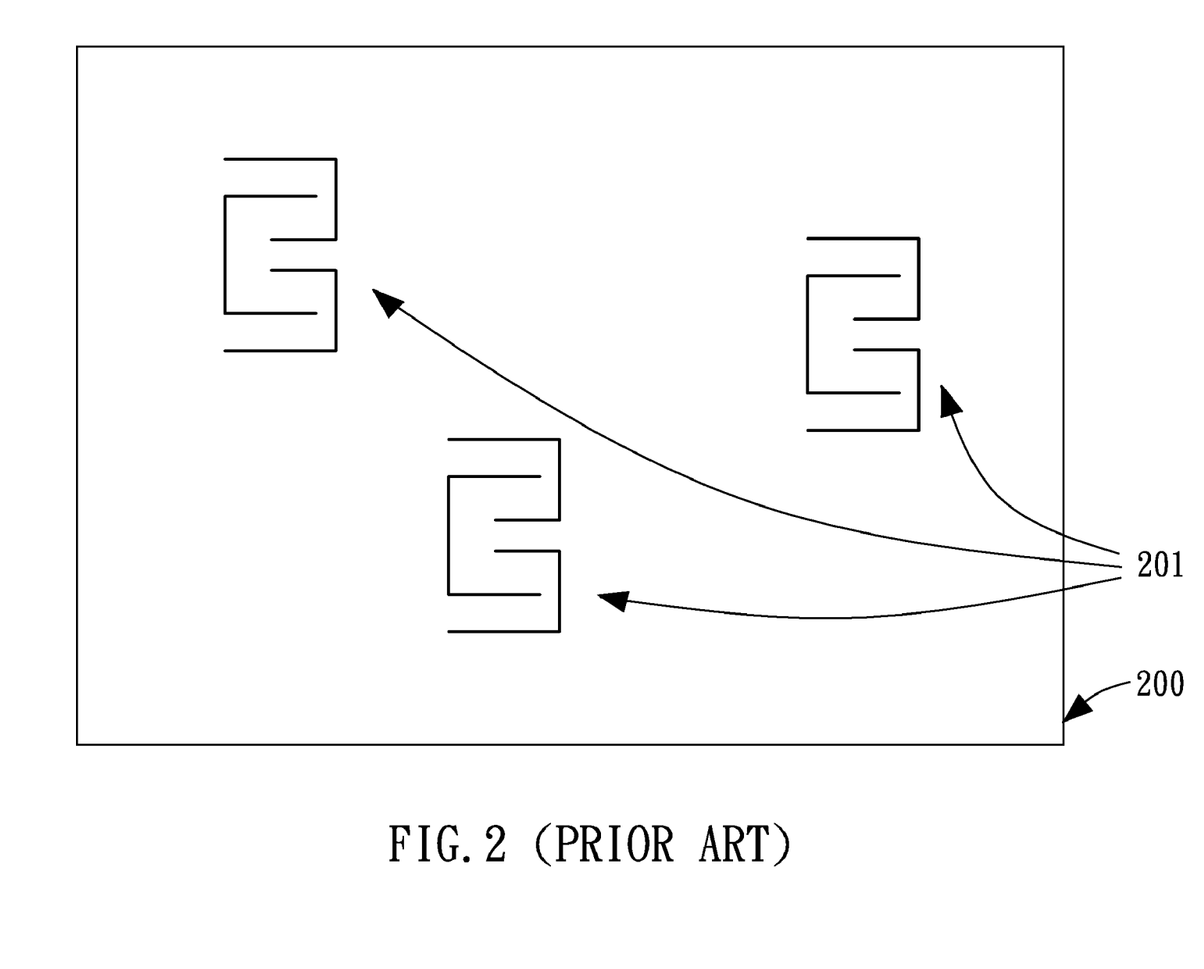
FIG. 2 is a schematic illustration of an irregularly distributed repetitive pattern.

A repetitive pattern may be formed in either a regular or irregular/random distribution over the die. Here, a regularly distributed pattern indicates an orderly layout of that pattern over the die, while an irregularly or randomly distributed pattern indicates a relatively unpredictable layout of that pattern over the die. Identical patterns on dies, repetitive or non-repetitive, may be repeated on a substrate. This can be understood with reference to FIG. 1 and FIG. 2 which schematically illustrate a regularly distributed repetitive pattern and an irregularly distributed repetitive pattern, respectively. As shown in FIG. 1, a die 100 comprises thereon a repetitive pattern 101, wherein the repeated patterns 101 are orderly arrayed on die 100. As shown in FIG. 2, a die 200 comprises thereon a repetitive pattern 201, wherein the repetitive patterns 201 are randomly distributed over die 200.

In the manufacture of semiconductor devices, the patterned substrates are inspected for defects so that successful production of acceptable devices can be achieved. Inspection of a patterned substrate can be carried out through various technologies, among which one large category is the image-based inspection tools. In an image-based inspection, one or more images of the substrate/die are obtained using an imaging apparatus. The optical source of the imaging apparatus may be, for example, a charged particle beam (ion beam, electron beam), a laser beam, etc. Then, the images are analyzed to identify the presence of defects on the substrate/die. By means of the images, target patterns are compared in various ways and/or against various references, so that presence of abnormalities in the target patterns can be determined from the images. For example, in the case of electron beam inspection, grey level images of the substrate/die are obtained using an electron beam imaging apparatus. Grey level profiles of the imaged (target) patterns are compared to identify the presence of abnormal grey level(s) which may be recognized later as defects.

The image-based inspection tools generally can be operated using either of two approaches. In one approach, a set of one or more dies of interest is compared with one or two reference dies. The target and reference dies comprise identical patterns, repetitive or non-repetitive, and in the case of repetitive patterns, the patterns can be regularly or irregularly distributed at corresponding locations on the target and reference dies, respectively. Each target die is compared against the reference die(s), pattern by pattern, to determine the presence of defect(s) on the target die. The reference die(s) may be another imaged die(s), such as for example one which is arbitrarily determined to be defect-free. Alternatively, the reference die can be provided from a database. In common practice, this approach can be performed by comparing two dies, with one being the target die and the other being the reference die. Alternatively, it can be performed by comparing three or more dies in a one-by-one fashion, wherein one common die is simultaneously compared against the other dies and wherein the common die is the target die to be inspected with the other dies serving as the reference and arbitration dies. For convenience of description, this approach will be referred to as the Random Mode inspection.

In the other approach, an area on the die(s) is selected for inspection, wherein the selected area should include a repetitive pattern which is regularly distributed. Recall that a repetitive pattern, by definition used herein, is formed in a repeating period equal to or greater than two within the die. Patterns from individual repeating periods are compared against each other so as to determine the presence of defects in the selected area. In particular, feature patterns from a corresponding location in an individual repeating period are compared against each other. If multiple areas are to be inspected simultaneously, each of the selected areas again should comprise identical repetitive patterns, and corresponding patterns from some or all selected areas may be put in comparison (e.g., compared) together. It is noted that the selected areas may be on the same die or different dies. For convenience of description, this approach will be referred to as the Array Mode inspection.

Generally, the Random Mode method is applied to the inspection of repeating dies wherein the target pattern on each die must be identical in the form of a repetitive or non-repetitive pattern. In the case of a repetitive pattern, the pattern can be regularly or irregularly distributed over the die but must be at the same location on each die. Inspection of the die is performed by comparing it, pattern by pattern, with a reference. The reference can be other imaged die, or a database graphic representing identical patterns as the die. In other words, for the Random Mode inspection to work, presence of a reference is a must.

The Array Mode on the other hand can only be used for the inspection of regularly distributed repetitive patterns. Orderly distributed repeating periods must be present on the die. In other words, there should be at least two identical patterns in regular distribution over the die for the Array Mode to work. Inspection of the die is performed by comparing target patterns from individual periods considered to be repeating periods. In some cases, the periods considered as repeating periods may be located on the same die or different dies.

In summary, adequate repetition of pattern within a single die is essential for the Array Mode inspection to be performed, while presence of one or more reference die/database graphics representing identical patterns as the die is essential to the Random Mode inspection.

The Array Mode is often preferred over the Random Mode in the inspection of a die having repetitive patterns (repeating period>1), because in the Array Mode only one die (the die itself) needs to be imaged, which is time saving. However, for a die having non-repetitive patterns (repeating period=1) the Array Mode inspection is no longer practical because there is no repetition of patterns. The Random Mode must be used, and a reference must be available to carry out the inspection.

Therefore, as would be understood by those skilled in the art, single die defect detection/inspection alone of a piece of a unique die having non-repetitive patterns is not possible for the Array Mode method as there is no repetition of pattern and is only possible for the Random Mode method when a database graphic of the die is available as a reference. However, the later sometimes raises the confidentiality issue on the customer side.

Another difficult scenario is single die inspection of a repetitive pattern which is irregularly distributed over the die of interest. The Array Mode method is not practical in such a case because the patterns are not orderly repeated, and as mentioned for the Random Mode method to work a database graphic of the die must be available as a reference.

In other words, the Random Mode inspection performed with a database reference is currently the only solution for single die inspection of non-repetitive or irregularly distributed repetitive patterns. Without a database graphic of the die of interest, neither the conventional Random Mode or Array Mode inspection is applicable for such a task.

Accordingly, each of the conventional Random Mode and Array Mode inspections has its own limitation. Therefore, it is desired at least to have a more flexible method, for example one which is able to eliminate the need for the reference die or database graphic of the die in the Random Mode inspection method, especially for single die inspection.

SUMMARY OF THE INVENTION

In one embodiment of the present invention, a substrate inspection method is disclosed. The disclosed method comprises 1) providing one or more images of one or more sample substrates; 2) identifying, from the images, a target pattern which multiply appears/occurs (e.g., appears or occurs two or more times) in the images; and 3) comparing the identified target-pattern occurrences against each other to determine, from the images, a presence of abnormalities in the compared target-pattern occurrences, thereby determining one or more defects physically present in the target-pattern occurrences.

In one example, each of the sample substrates has one or more dies thereon, and each of the dies has one or more patterns thereon. In another example, the identified target-pattern occurrences are located on one or more of the dies.

In another embodiment of the present invention, the disclosed method is implemented via execution of a computer program encoded in a computer readable medium, wherein the computer program instructs an imaging apparatus to form images of the sample substrates of interest and instructs an image analyzing apparatus to identify and compare, from the images, the target-pattern occurrences on the sample substrates.

In one example, the image analyzing apparatus is electrically coupled with the imaging apparatus to receive the obtained images from the imaging apparatus.

DESCRIPTION OF THE EXEMPLARY EMBODIMENTS

Although the present invention will be described in accordance with the embodiments exemplified below, one of ordinary skill in the art will recognize that there can be variations to the embodiments which variations would be within the spirit and scope of the present invention. Accordingly, many modifications may be made by one of ordinary skill in the art without departing from the spirit and scope of the appended claims.

<Definition of segment and segment maps> First, a target pattern is selected and marked as a "segment" belonging to a predefined "segment classification." Then, a geographical distribution of the marked segment(s) over the die(s) of interest is identified and marked as a "segment map." In other words, a segment map can be used to group a selected target pattern, for example as a convenience for subsequent process steps in the inspection action, by including the segments representing the target pattern. A segment map may include one or multiple segments. In an example, one segment map includes only segments of the same segment classification.

In one example, if all of the designated segments are present on a single die, a segment map is created and attached to this die. On the other hand, if the designated segments are present on multiple dies, these dies may either be grouped with each having a corresponding segment map attached thereto, or be grouped all together and assigned a virtual die (for example in a different recipe with a different die definition), and then a single segment map is created and attached to this created virtual die.

In summary, one segment classification corresponds to one candidate target pattern to be inspected, one segment represents one target pattern actually showing up in the image, and all segments in one segment map are identical. In one example, one segment map is used for performing one inspection action. In another example, multiple segment maps are included in one inspection action. For instance, during inspection of a single die, multiple segment maps may be created and attached to this die with each map representing the distribution of segments of a different segment classification (thus a different candidate target pattern) over this die.

The designated segments are then compared to reveal the presence of defect(s) in the target pattern on the die(s). As one segment represents one target pattern which includes one or more feature patterns (contact holes, metal lines, etc.), comparison of the segments may be performed by comparing the individual feature patterns, for example in a one-by-one fashion. This method will be referred to as the "Segment Mode" inspection.

In an example, not all segments in one segment map are examined. For instance, three out of five segments in a segment map may be selected and examined, for example by creating a separate segment map containing these three selected segments, and then the yield of the die(s) to which this segment map is attached is estimated through statistical methods.

In one example, the target pattern is a non-repetitive pattern. In another example, the target pattern is an irregularly distributed repetitive pattern. It is noted, however, that the disclosed method can also be used to inspect a regularly distributed repetitive pattern which is conventionally inspected by using the Array Mode or Random Mode methods. For example, by defining the segment to be encompassing (representing) a complete die, the disclosed Segment Mode method is essentially identical to the conventional Random Mode method. For a die with a regularly distributed repetitive pattern, the segment can be selected to represent a single repeating period of the pattern, and the disclosed Segment Mode method thus becomes essentially identical to the conventional Array Mode method.

Embodiment 1

Single Die Inspection, Regularly Distributed Repetitive Pattern

Figure 3A:
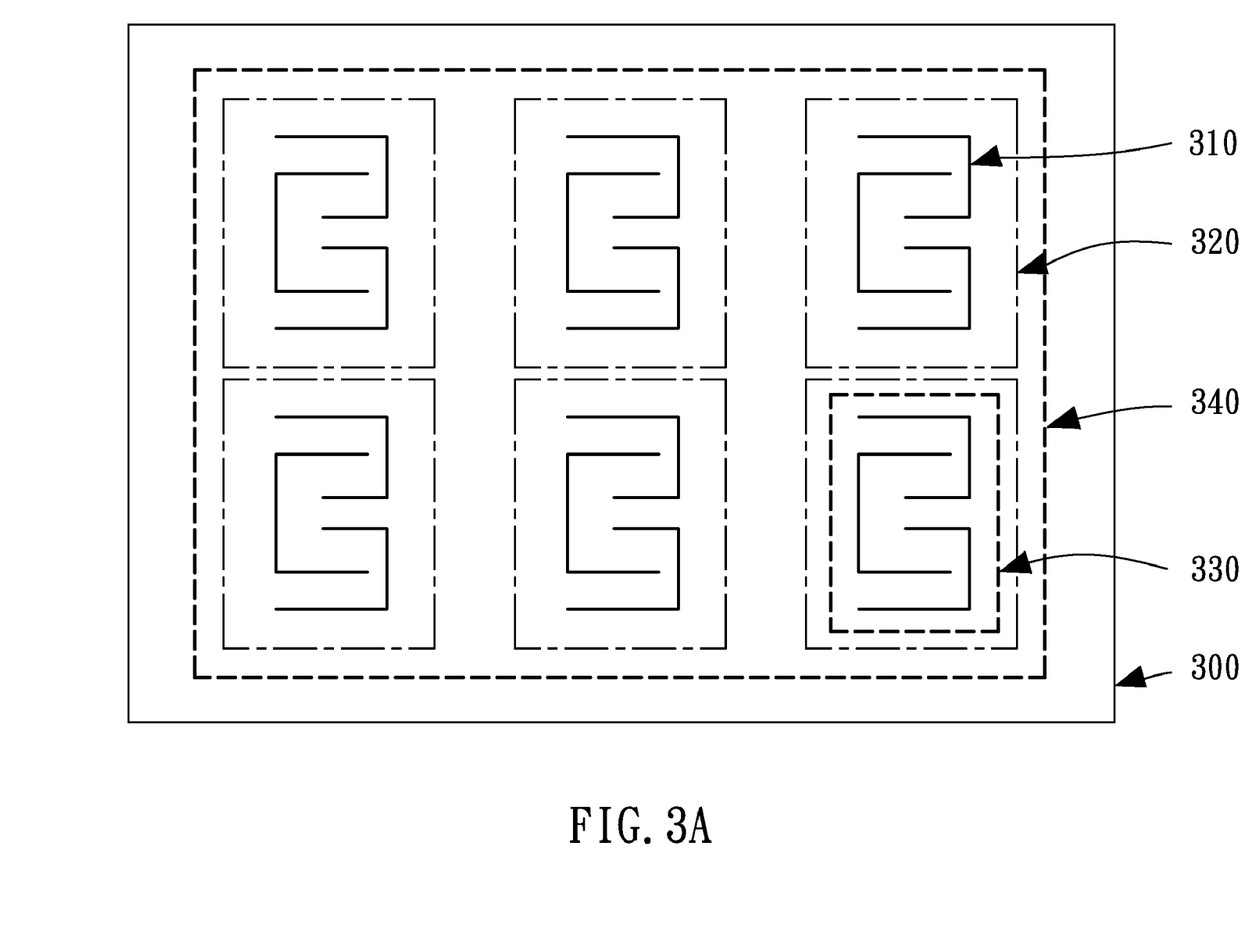
FIG. 3 illustrates single die inspection of a regularly-distributed repetitive pattern in accordance with an embodiment of the present invention.
Figure 3B:
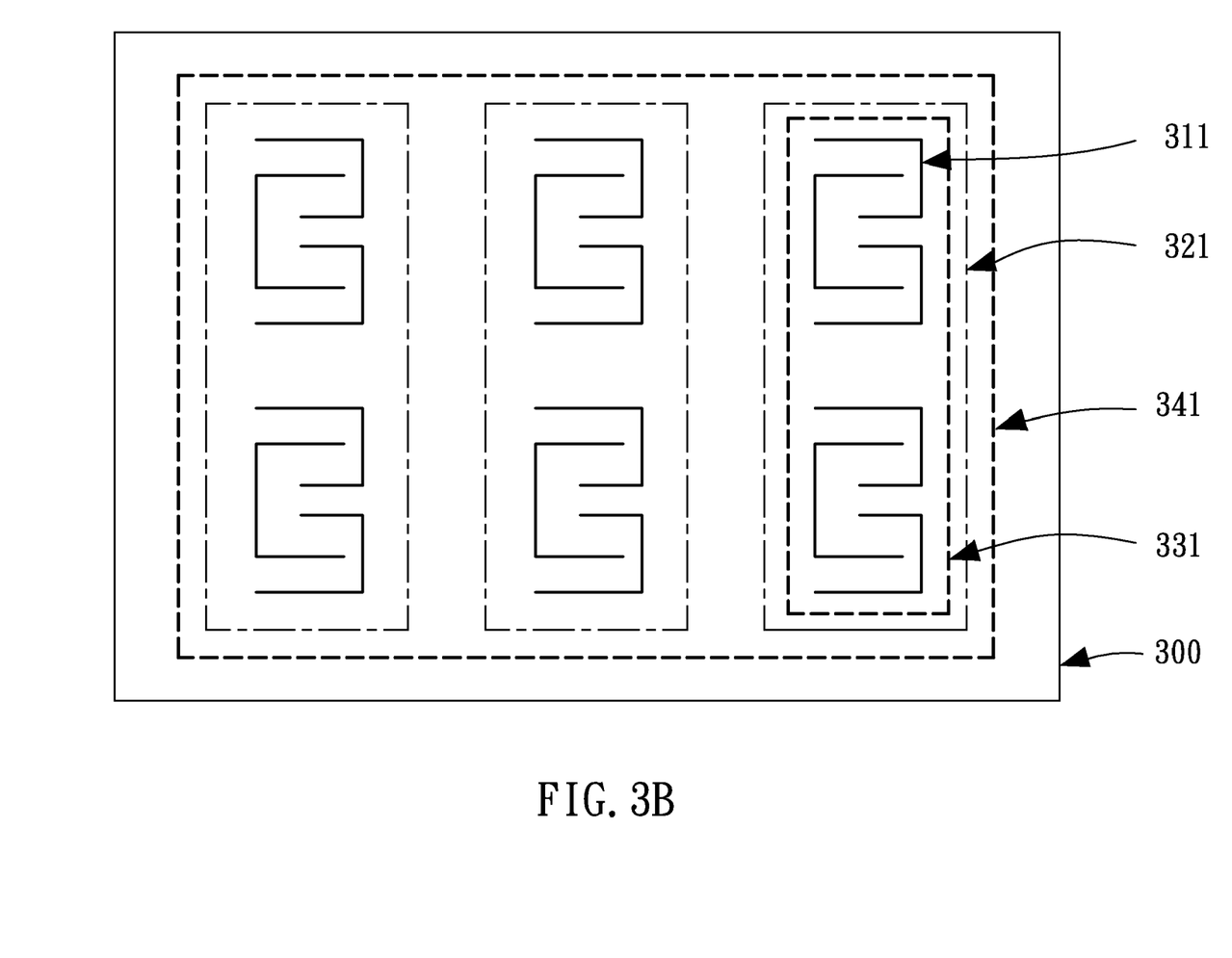
Figure 3C:
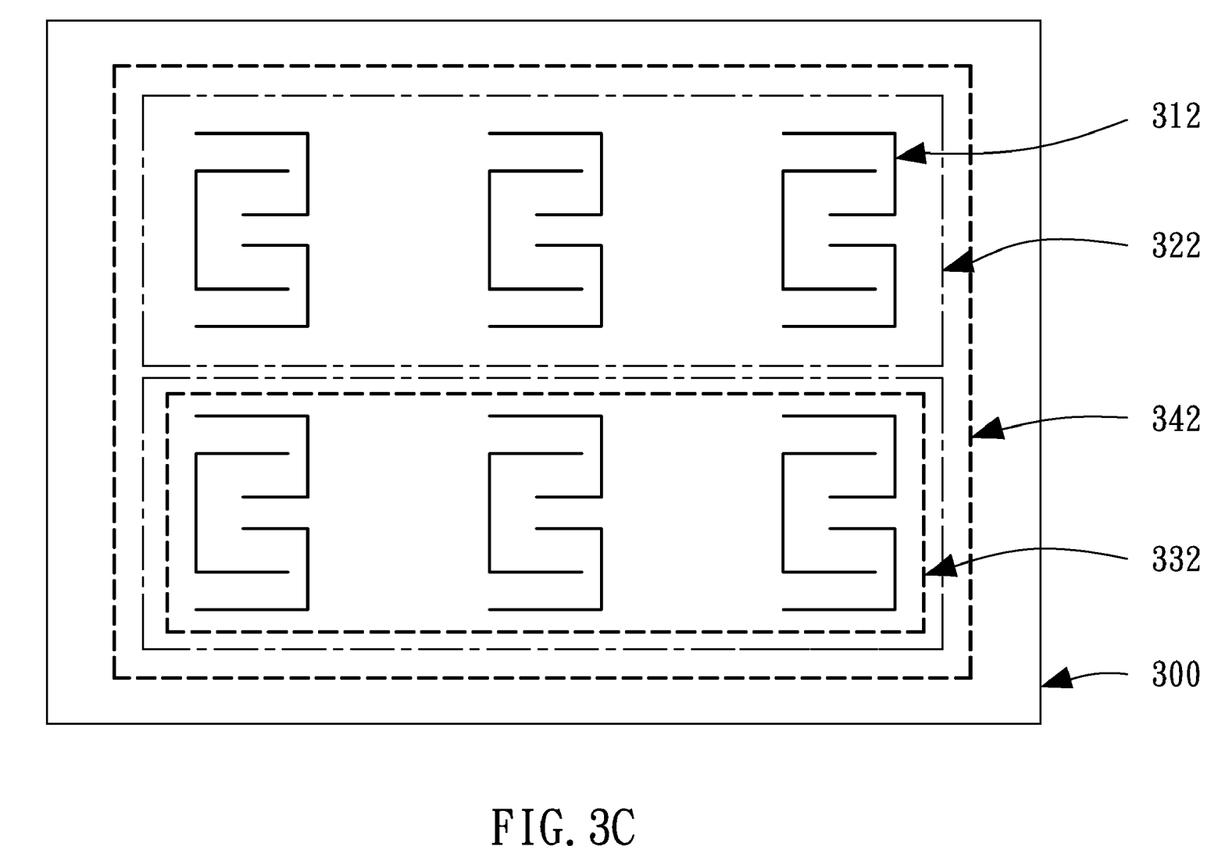

FIG. 3 illustrates single die inspection of a regularly-distributed repetitive pattern in accordance with an embodiment of the present invention. A single die of interest 300 is being inspected. There are two possible forms of single die inspection, wherein in one form the die is the only die formed on the of-interest sample substrate (for example the inspection of a photolithography mask), and in the other form multiple dies are formed on the sample substrate but only one unique die is of interest. As shown, a die of interest 300 comprises a repetitive pattern 310 formed in a repeating period 320 of six (FIG. 3A). Alternatively, die 300 can be seen to comprise a repetitive pattern 311 formed in repeating periods 321 of three (FIG. 3B), or a repetitive pattern 312 formed in repeating periods 322 of two (FIG. 3C). For simplicity, FIG. 3A will be considered for the following description.

A segment can comprise one or more unit/single repetitive patterns. As shown, segment 330 is defined to encompass and represent only one (e.g. a unit/single) repetitive pattern 310. Then, a segment map 340 is created and all segments 330 are added to the created segment map 340. As a result, each segment map 340 has six segments 330, thus six (unit/single) repetitive patterns 310. Alternative segments 331/332 and associate segment maps 341/342 are shown in FIG. 3B and FIG. 3C, respectively. As shown, each segment map 341 has three segments 331 (thus three unit repetitive patterns 311), and each segment map 342 has two segments 332 (thus two unit repetitive patterns 312). Next, segments 330 included in segment map 340 are compared in specified manners to carry out inspection of segments 330 for presence of defects therein.

According to one aspect, for the current and subsequent embodiments, each instance of a target pattern (e.g., each occurrence or appearance of a repetitive target pattern 312) may, but need not necessarily, be referred to as a target-pattern appearance or target-pattern occurrence, instead of being referred to as a segment, such that e.g. the period 320 can be said to comprise six target-pattern occurrences.

With continuing reference to FIG. 3A, in general cases, segments 330 may be compared in a one-by-one fashion. In one example, the comparison of segments 330 can be carried out in a dyadic or triadic manner as with the comparison of dies described earlier in connection with the conventional Random Mode inspection method. In the dyadic manner comparison, two segments 330 are compared with one being the target and the other being the reference, and in the triadic manner comparison, three segments 330 are compared with one being the target and the other two being the references. More segments 330 may be compared simultaneously as well, with one being the target and the others being the references.

It is therefore noted that at least two segments 330 must be present for the Segment Mode method to work. In other words, the target pattern (310) should appear at least twice on die 300, or the sample substrate, so that the disclosed Segment Mode method can be used for inspection of die 300/the sample substrate.

It is further noted that as the target pattern 310 is a repetitive pattern in a regular distribution over die 300, inspection of die 300 can also be carried out by using the Array Mode method. The Random Mode inspection cannot be used in this case because this embodiment is a single die inspection scenario and there is no reference available for comparison.

Embodiment 2

Single Die Inspection, Irregularly Distributed Repetitive Pattern

Figure 4:
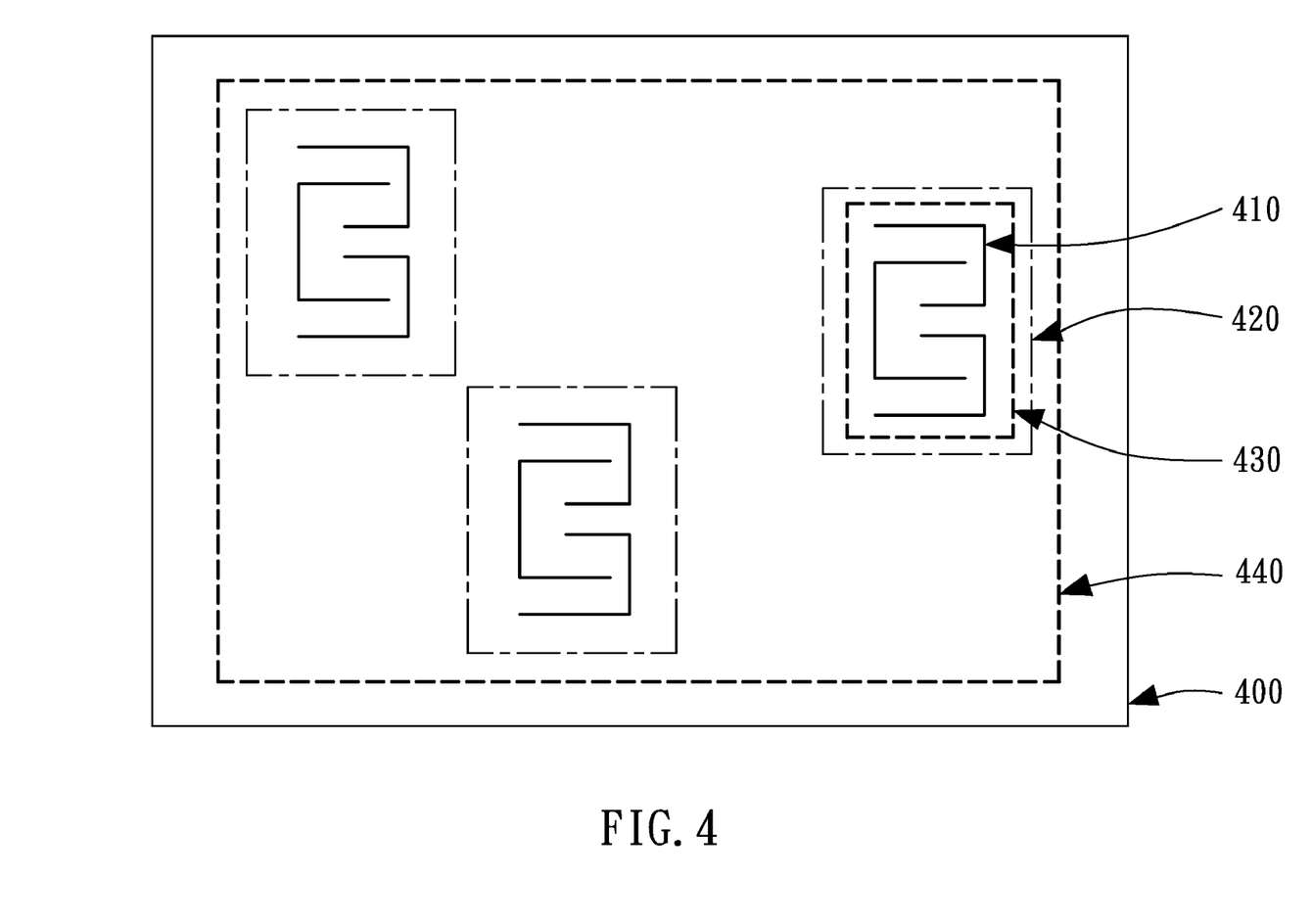
FIG. 4 illustrates single die inspection of an irregularly-distributed repetitive pattern in accordance with an embodiment of the present invention.

FIG. 4 illustrates single die inspection of an irregularly-distributed repetitive pattern in accordance with an embodiment of the present invention. As shown, a die of interest 400 comprises a repetitive pattern 410 formed in a repeating period 420 of three. A segment 430 is defined to encompass and represent one (unit/single) repetitive patterns 410. Then, a segment map 440 is created and all segments 430 are added to the created segment map 440. As a result, each segment map 440 has three segments 430, thus three (unit/single) repetitive patterns 410. Next, segments 430 included in segment map 440 are compared in one or more specified manners to carry out inspection of segments 430 for a presence of defects therein. Details of comparison are similar to those described in the embodiment of FIG. 3 and will not be repeated here.

In this embodiment, target pattern 410 is a repetitive pattern but in an irregular distribution over die 400. Therefore, the Array Mode method cannot be used in this case. The Random Mode method cannot be used either, because this embodiment is a single die inspection scenario and there is no reference available. Through the Segment Mode method of this embodiment, however, inspection of target pattern 410 on die 400 can be carried out via comparison of the three segments 430.

Embodiment 3

Multiple Die Inspection, Regularly Distributed Repetitive Pattern

Figure 5:
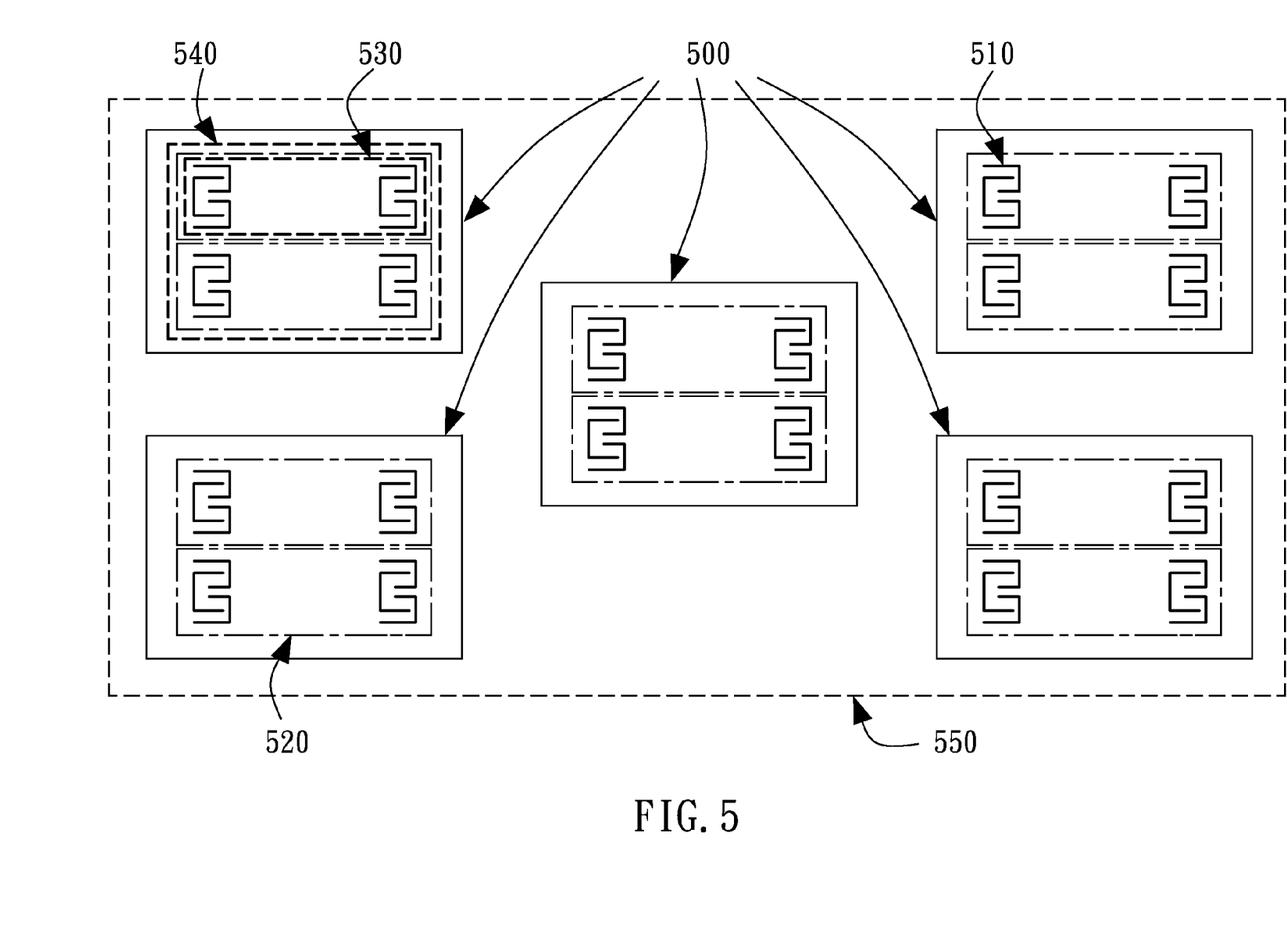
FIG. 5 illustrates multiple die inspection of a regularly-distributed repetitive pattern in accordance with an embodiment of the present invention.

FIG. 5 illustrates multiple die inspection of a regularly-distributed repetitive pattern in accordance with an embodiment of the present invention. As shown, each of the dies of interest 500 comprises an identical repetitive pattern 510 formed in a repeating period 520 of two.

In this embodiment, target pattern 510 is a repetitive pattern in regular distribution over dies 500. The Random Mode of inspection can be used in this case, for example two or three dies 500 can be grouped and compared with one being the target and the others being the references. In addition, the Array Mode of inspection can be used to perform single die inspection for individual die 500 as well, as there are two repeating periods existing in each die 500.

The disclosed Segment Mode inspection can be used in this case, too. As shown, for each die 500, a segment 530 is defined to encompass and represent one (unit/single) repetitive pattern 510, and a segment map 540 is created to include the defined segments 530. As a result, each segment map 540 has two segments 530, thus two (unit/single) repetitive patterns 510. Next, segments 530 included in segment map 540 are compared against each other in specified manners to carry out inspection of segments 530. In one example, individual die 500 is inspected independently. For instance, segments 530 in individual die 500 are compared against each other with one being the target and the other being the reference, so as to determine the presence of defects on that die 500. In another example, multiple dies 500 are inspected simultaneously. For instance, segments 530 from some or all five dies 500 are compared simultaneously.

For the later case, a die selection step may be performed to identify and categorize dies 500, as illustrated by the large die selection circle 550. Die selection 550 selects and groups the dies 500 on the of-interest sample substrate being inspected (in this embodiment, all dies 500 are selected, as illustrated in the figure). Then, the selected dies 500 may be examined independently or as a whole by comparing segments 530 present on these selected dies 500. Details of the comparison are similar to those described in the embodiment of FIG. 3 and will not be repeated here.

Embodiment 4

Multiple Die Inspection, Irregularly Distributed Repetitive Pattern

Figure 6:
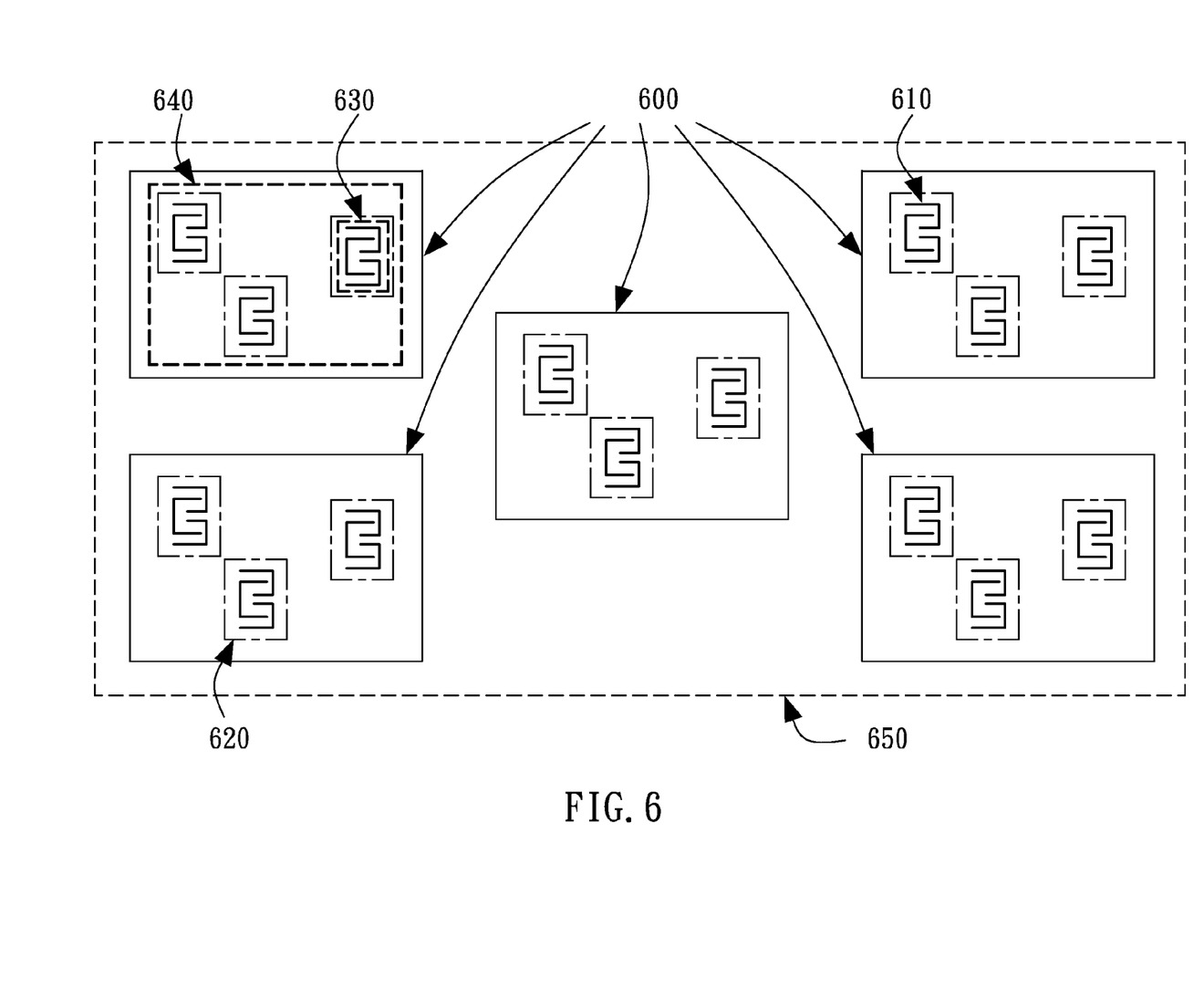
FIG. 6 illustrates multiple die inspection of an irregularly-distributed repetitive pattern in accordance with an embodiment of the present invention.

FIG. 6 illustrates multiple die inspection of an irregularly-distributed repetitive pattern in accordance with an embodiment of the present invention. As shown, a die of interest 600 comprises a repetitive pattern 610 formed in a repeating period 620 of three. A segment 630 is defined to encompass and represent one (unit/single) repetitive pattern 610. Then, a segment map 640 is created and the defined segments 630 are added to the created segment map 640. As a result, a segment map 640 has three segments 630, thus three (unit/single) repetitive patterns 610. In one example, for each segment map 640, segments 630 included therein are compared in specified manners to carry out inspection of segments 630 i.e. each die 600 is inspected independently by comparing segments 630 thereon. In another example, multiple dies 600 are inspected simultaneously, for instance segments 630 from some of or all five dies 600 are compared simultaneously. For such case, a die selection step may be performed to identify and categorize dies 600, as illustrated by the large die selection circle 650. Die selection 650 selects and groups the dies 600 on the of-interest sample substrate being inspected (in this embodiment, all dies 600 are selected as illustrated in the figure). Then, the selected dies 600 may be examined independently or as a whole by comparing segments 630 present on these selected dies 600. Details of the comparison are similar to those described in the embodiment of FIG. 3 and will not be repeated here.

It is noted that in this embodiment, multiple dies 600 are to be inspected. By applying the disclosed Segment Mode method as described above, the dies 600 need not to be on the same sample substrate or in the same image to be included in die selection 650. In one example, the illustrated dies 600 are located on different sample substrates and are still included in the same die selection 650. In another example, the illustrated dies 600 are from different images and are still included in the same die selection 650. Accordingly, dies from different substrates or images can be inspected all together, allowing more flexibility and efficiency in solving a multiple die inspection task.

It is also noted that in this embodiment, target pattern 610 is a repetitive pattern in irregular distribution over die 600. The Random Mode inspection can be used in this case, for example two or three or more dies 600 can be grouped and compared with one being the target and the others being the references. The Array Mode, however, cannot be used because the patterns are not orderly arrayed on the die 600.

Embodiment 5

Multiple Die Inspection, Non-Repetitive Pattern

Figure 7:
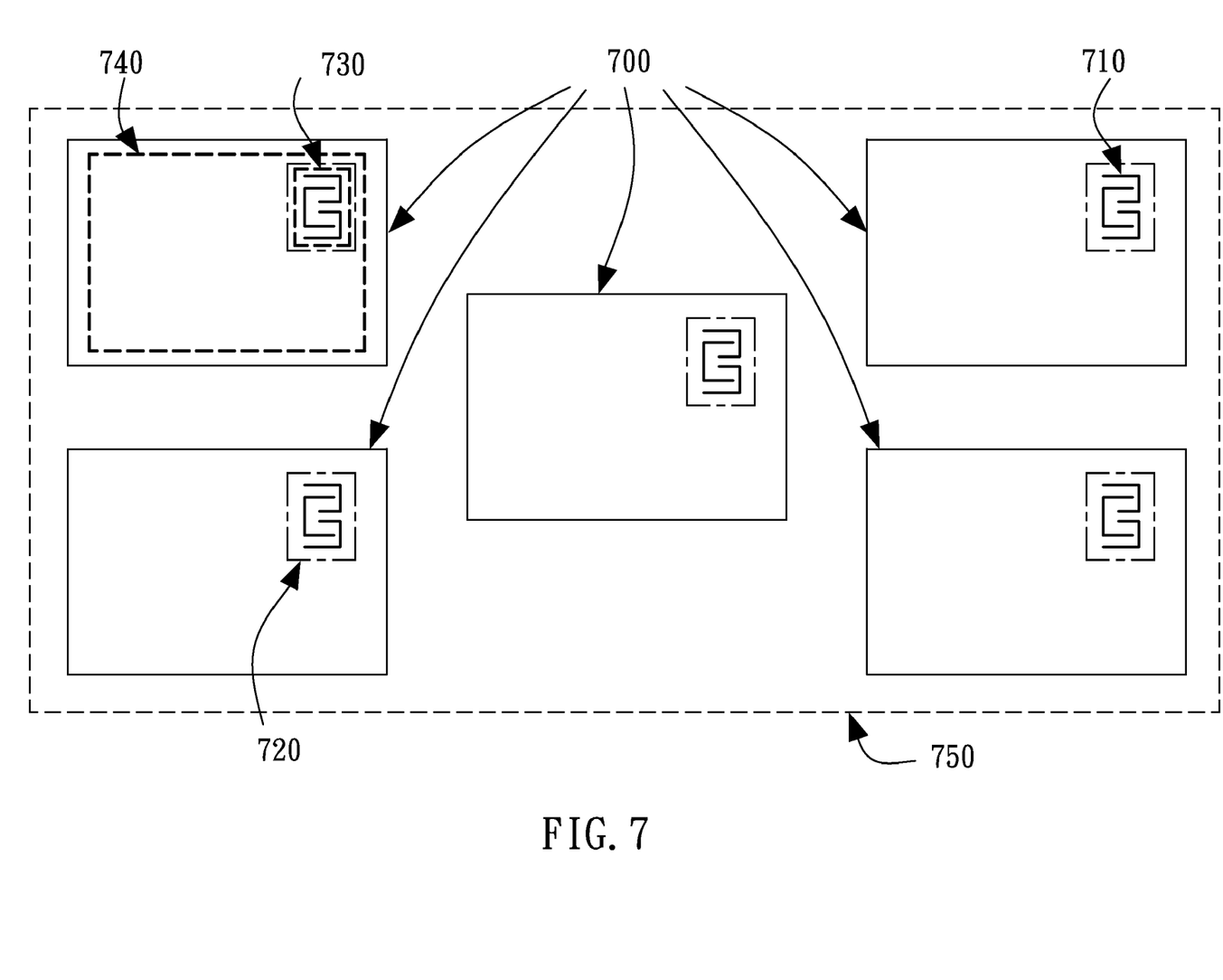
FIG. 7 illustrates multiple die inspection of a non-repetitive pattern in accordance with an embodiment of the present invention.

FIG. 7 illustrates multiple die inspection of a non-repetitive pattern in accordance with an embodiment of the present invention. As shown, a die of interest 700 comprises a non-repetitive pattern 710 formed in a repeating period 720 of only one. A segment 730 is defined to encompass and represent one (unit/single) repetitive pattern 710. Then, a segment map 740 is created and the defined segment 730 is added to the created segment map 740. As a result, one segment map 740 comprises one segment 730, thus one (unit/single) repetitive pattern 710.

In this embodiment, target pattern 710 is a non-repetitive pattern. The Random Mode inspection can be used in this case, for example two or three or more dies 700 can be grouped and compared with one being the target and the others being the reference(s). The Array Mode, however, cannot be used because there is no repetition of pattern on the dies 700.

The disclosed Segment Mode inspection can be used in this case. In this embodiment, as each segment map 740 comprises only one segment 730, segment map 740 (thus the die 700 it attaches to) cannot be examined independently. Two or more segments 730, each from a corresponding segment map 740, must be compared together in specified manners to carry out the inspection of segment 730. A die selection step may be performed to identify and categorize dies 700, as illustrated by the large die selection circle 750. Die selection 750 selects and groups the dies 700 that are to be inspected (as described in the previous embodiment, these selected dies 700 may be from the same of-interest sample substrate, different sample substrates, the same image, or different images), and then the selected dies 700 may be examined as a whole by comparing segments 730 present on these selected dies 700. Details of the comparison are similar to those described in the embodiment of FIG. 3 and will not be repeated here.

Embodiment 6

Multiple Die Inspection, Mixture of Repetitive and Non-Repetitive Patterns

Figure 8:
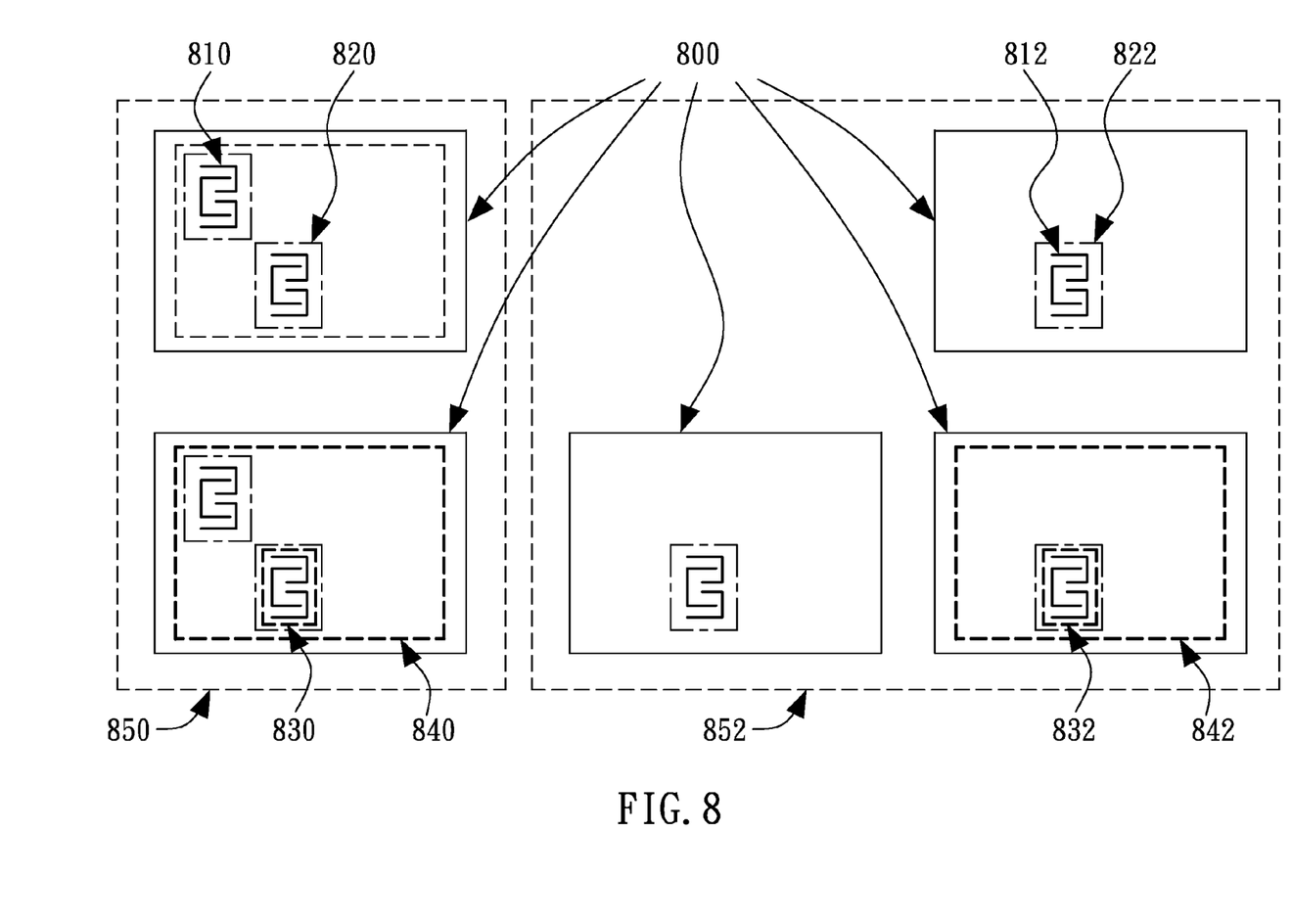
FIG. 8 illustrates multiple die inspection of mixed repetitive and non-repetitive patterns in accordance with an embodiment of the present invention.

FIG. 8 illustrates multiple die inspection of mixed repetitive and non-repetitive patterns in accordance with an embodiment of the present invention. In this embodiment, the dies of interest 800 can be categorized into two groups, one having a repetitive pattern 810 and the other having a non-repetitive pattern 812. As shown, repetitive pattern 810 is formed in a repeating period 820 of two and is irregularly distributed over die 800. Non-repetitive pattern 812 on the other hand, is formed in a repeating period 822 of only one.

It is noted that in FIG. 8 the target unit repetitive pattern 810 is identical to the target unit non-repetitive pattern 812. This is merely for simplicity of explanation and is not necessary in real practice i.e. the unit repetitive pattern 810 may be different from the unit non-repetitive pattern 812 as well. It is also noted that although a specific scenario of irregularly distributed repetitive pattern (810) mixed with a non-repetitive pattern (812) has been illustrated in FIG. 8, other examples regarding the repetition and distribution of the target pattern on the die are also possible. For such cases, similar concepts/techniques as those which will be described in this embodiment will still apply.

In this embodiment, dies 800 comprise an irregularly-distributed repetitive pattern 810 and a non-repetitive pattern 812. Apparently, the Array Mode method cannot be used here because the patterns 810/812 are not a regularly distributed repetitive pattern. The Random Mode method can be used to respectively inspect die 800 having patterns 810 or 812. For example, the two dies 800 having pattern 810 can be compared against each other, with one being the target and the other being the reference, to detect defects thereon, and the three dies 800 having pattern 812 can be compared against each other, with one being the target and the others being the reference, to detect defects thereon. Comparison of dies across the two groups is however, not possible as the die layouts are different. Therefore, to inspect all five dies 800 using the Random Mode method, at least two inspection actions, with one for examining pattern 810 and the other for examining pattern 812, are needed. This means overhead time will be unavoidable as a result of repeated initialization for the mechanical and electronics systems of the imaging apparatus, such as stage positioning, column focusing, etc.

Therefore, in solving the inspection task presented in this embodiment, each of the conventional Array and Random Mode methods is limited in one way or another. The Segment Mode disclosed by the present invention, however, can provide more flexibility for such tasks, as will be described below.

As shown in FIG. 8, in the illustrated embodiment, die selection is performed to identify and categorize individual die 800 based upon their pattern layout. Two groups of patterns, respectively denoted as die selection 850 and 852, are thus obtained, wherein die selection 850 corresponds to the repetitive pattern 810, and die selection 852 corresponds to the non-repetitive pattern 812. Segments 830/832 are defined to encompass and represent (unit/single) target pattern 810/812 on dies 800 for die selection 850 and 852, respectively. Then, segment maps 840 and 842 are created to include corresponding segments 830 and 832.

Then, segment maps 840/842 from corresponding die selections 850/852 may be inspected to determine the presence of defects therein. For example, for die selection 850, the two segments 830 from one segment map 840 (thus from one die 800) may be compared against each other with one being the target and the other the reference so as to carry out inspection of patterns 810 represented by these two segments 830. Alternatively, the four segments 830 from the two segment maps 840 may be compared together, for instance with one being the target and the others being the reference. On the other hand, for die selection 852, multiple segments 832 with each from a different segment map 842 (thus a different die 800) may be compared with one being the target and the reset being the reference.

Therefore, as the conventional Array Mode method is not able to inspect the irregularly-distributed repetitive pattern 810 and non-repetitive pattern 812, the disclosed Segment Mode method is more capable and flexible in doing so.

It is noted that, in the above implementation of the disclosed Segment Mode method, two inspection actions are still required (one for inspecting pattern 810 and the other for 812), and the overhead time issue remains.

This can be overcome by another way of implementation for the disclosed Segmented Mode inspection method. As mentioned earlier, in this embodiment, the (unit/single) target pattern 810 and 812 are identical i.e. die selection 850 and 852 only differ in the pattern layouts on dies 800. Therefore, segments 830 and 832 are actually representing the same (unit/single) target pattern. For such case, comparison across die selection 850/852 is possible. For example, one or multiple segments 830 from die selection 850 may be compared against each other, and also against one or multiple segments 832 from die selection 852. As a result, all dies 800 are able to be inspected simultaneously, regardless of the pattern layouts thereon (for example, regardless of whether the patterns to be examined are repetitive or non-repetitive, as long as they are identical). Such implementation will be described in more details in Embodiment 7.

It is noted that, as in the previous embodiments, in different examples of this embodiment the dies 800 may be from the same of-interest sample substrate, different sample substrates, the same image, or different images.

Embodiment 7

Figure 9:
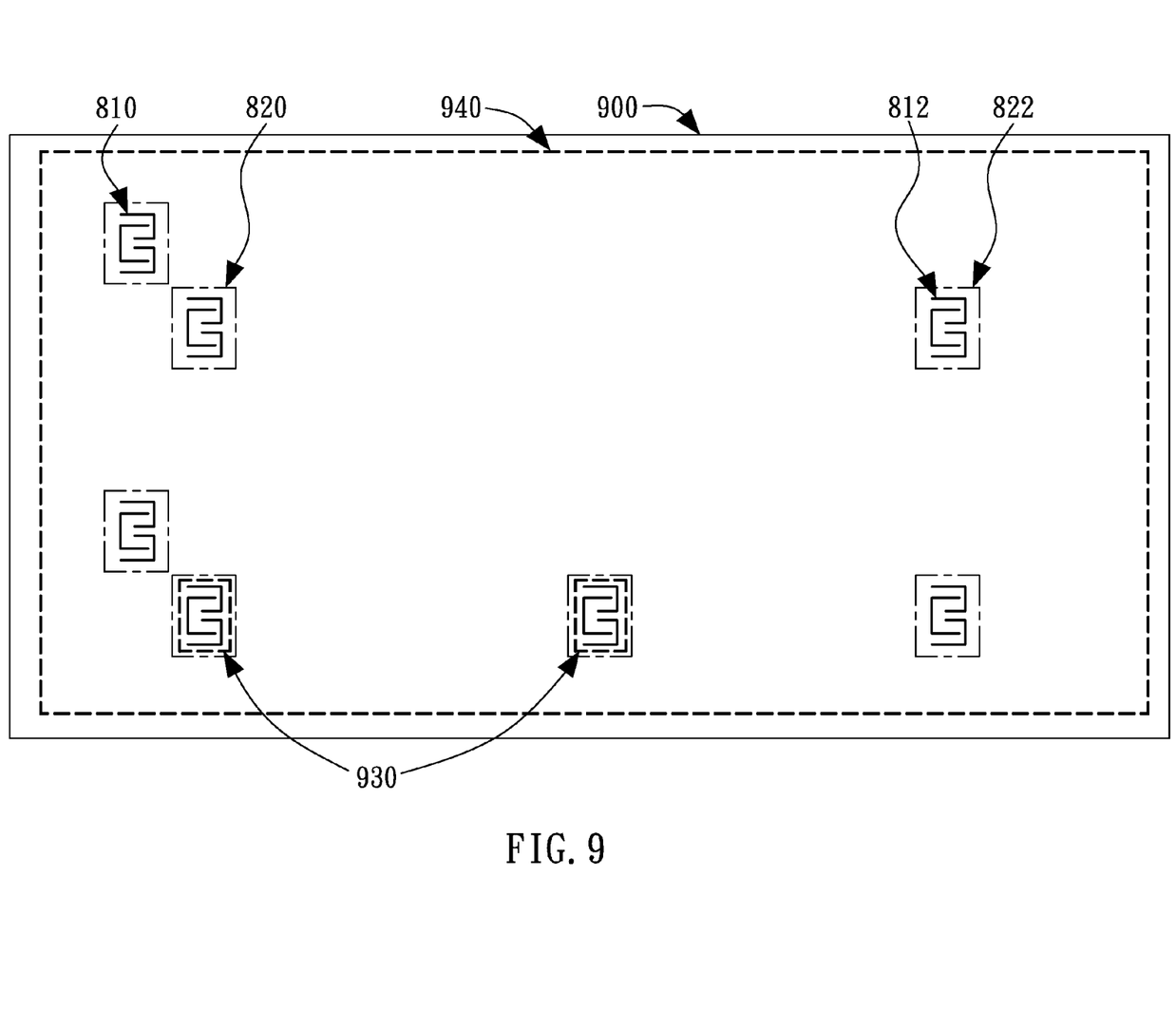
FIG. 9 illustrates multiple die inspection of mixed repetitive and non-repetitive patterns in accordance with an embodiment of the present invention.

Multiple Die Inspection Transformed to Single Die Inspection, Mixture of Repetitive and Non-Repetitive Patterns FIG. 9 illustrates multiple die inspection of mixed repetitive and non-repetitive patterns in accordance with an embodiment of the present invention. The same of-interest sample substrate as in FIG. 8 is being inspected. In other words, the same dies 800 in FIG. 8 are being inspected in FIG. 9. Therefore, it can be seen from FIG. 9 that the same target patterns 810 and 812, at the same locations on the sample substrate as in FIG. 8, are being examined. Now, as the target pattern 810 and 812 are identical, they are assigned the same segment 930 wherein these designated segments 930 are included in a single segment map 940 which is attached to a defined single virtual die 900.

Then, inspection of this virtual die 900 can be performed by comparing segments 930 against each other in specific manners. Details of the comparison are similar to those described in the embodiment of FIG. 3 and will not be repeated here. In such way, one examination action is possible to be sufficient to examine all dies 800, as compared to Embodiment 6, and no reference is needed. As a result, one imaging action is possible to be sufficient for examination of all dies 800.

The overhead time issue is thus mitigated or resolved, allowing more room for process optimization (for example, the scan route in the case of a scanning electron beam microscope can be determined from being based on local optimization with regards to the location of the die selections on the sample substrate, to being based on global optimization from the view point of the overall sample substrate). Also, a reference is not required, allowing more flexibility for process design choice.

Embodiment 8

Multiple Die Inspection, Mixture of Repetitive and Non-Repetitive Patterns

Figure 10:
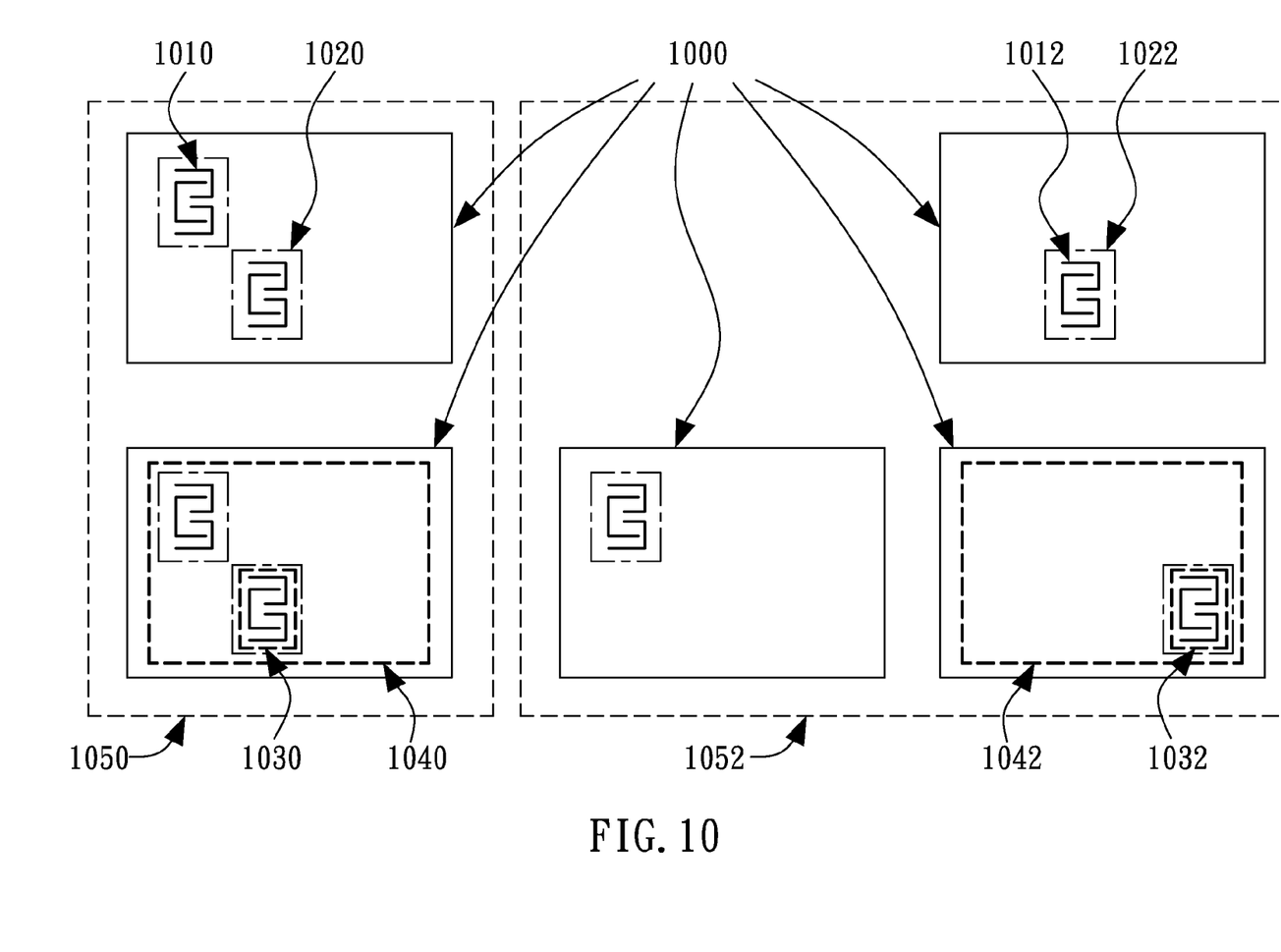
FIG. 10 is a schematic illustration of a multiple die inspection with target patterns located differently between dies in accordance with an embodiment of the present invention.

There may also be cases where the target patterns are irregularly distributed from one die of interest to another. FIG. 10 is a schematic illustration of multiple die inspection with target patterns located differently between dies in accordance with an embodiment of the present invention. As shown, dies of interest 1000 are identified and categorized into two groups 1050 and 1052 in a die selection step. Die selection 1050 comprises a repetitive pattern 1010 in a repeating period 1020 of two. For a die 1000 in die selection 1050, a segment 1030 is defined to encompass and represent the (unit/single) target pattern 1010, and an associate segment map 1040 is created to include the designated segments 1030.

On the other hand, die selection 1052 comprises a non-repetitive pattern 1012 in a repeating period 1022 of only one. For a die 1000 in die selection 1052, a segment 1032 is defined to encompass and represent the (unit/single) target pattern 1012, and an associate segment map 1042 is created to include the designated segment 1032. In particular, as shown, target pattern 1012 is located differently from one die 1000 to another in die selection 1052.

Conventionally, because the three non-repetitive patterns 1012 are located at different positions on individual dies 1000, the three dies 1000 in die selection 1052 cannot be inspected together by using for example the Random Mode method, and at least four examination actions (one for inspection of the repetitive pattern 1010 by using the Random Mode/Array Mode method, the other three for inspection of the individual non-repetitive patterns 1012 by using for example the Random Mode method with a database reference) must be performed to accomplish the inspection of all five dies 1000. In addition, database reference(s) must be available for inspecting each of the three differently-located non-repetitive patterns 1012, as such inspection is in fact a set of three single die inspection actions with each for a corresponding one of the three dies 1000 in die selection 1052.

Now, by using the disclosed Segment Mode method as implemented in FIG. 9, one inspection action (thus imaging action) is possible to be sufficient to examine all of the five dies 1000 by including them in a single defined virtual die and then performing a single die inspection through comparison of segments. No additional reference is needed. Therefore, again, more optimization possibilities and flexibility in the design of the inspection sequence, such as optimization of the scan route in the case of a scanning electron beam microscope, are provided.

It is noted that, as in the previous embodiments, in different examples of this embodiment the dies 1000 may be from the same of-interest sample substrate, different sample substrates, the same image, or different images.

As would be understood by those skilled in the ordinary art, the disclosed Segment Mode inspection method may be practiced by execution of a computer program encoded in a computer readable medium. For example, the computer program may be designed to instruct an imaging apparatus to form image(s) of the of-interest sample substrate(s). The imaging apparatus may be, for instance, a charged particle beam imaging apparatus such as a scanning electron beam microscope. Also, the computer program may be designed to instruct an image analyzing apparatus to identify and compare, from the obtained images, target patterns on the sample substrates. For example, in the comparison the target patterns may be represented by predefined segments, as described in the previous embodiments. It is noted that the image analyzing apparatus should be electrically coupled with the imaging apparatus so that the imaging analyzing apparatus can receive the obtained images of the substrates from the imaging apparatus.

Although the present invention has been explained in relation to its preferred embodiment, it is to be understood that other modifications and variation can be made without departing from the spirit and scope of the invention as hereafter claimed.

What is claimed is:

1. A substrate inspection method, comprising:
providing at least two images of one or more sample substrates, each of said sample substrates having one or more dies thereon and each of said dies having a plurality of patterns thereon;
identifying, from said images, a target pattern which occurs two or more times in said images, wherein said target pattern occurrences are located on one or more of said dies; and
comparing said target-pattern occurrences against each other to determine, from said images, a presence of abnormalities in said target-patterns occurrences, thereby determining a presence of one or more defects in said target-pattern occurrences.

2. The method of claim 1, further comprising repeating said identifying and comparing steps for another target pattern.

3. The method of claim 1, wherein each of said sample substrates has one of said die thereon.

4. The method of claim 1, wherein each of said dies has one identified target pattern thereon.

5. The method of claim 1, wherein within one die, the identified target-pattern occurrences are regularly distributed.

6. The method of claim 1, wherein within one die, the identified target-pattern occurrences are irregularly distributed.

7. The method of claim 1, wherein the identified target-pattern occurrences are located differently from one die to another.

8. The method of claim 1, wherein the identified target-pattern occurrences are located on multiple dies on different sample substrates.

9. The method of claim 1, wherein the identified target-pattern occurrences are located on multiple dies in different images.

10. The method of claim 1, wherein the identified target-pattern occurrences are located on multiple dies, and said method further comprises grouping multiple dies having the identified target-pattern occurrences such that grouped dies are imaged together in one imaging action.

11. The method of claim 1, wherein said images are formed with a charged particle beam imaging apparatus.

12. The method of claim 11, wherein said images are grey level images, and wherein the identified target-pattern occurrences are compared in their grey level profiles displayed in said images, and wherein said abnormalities are abnormal grey levels displayed by the identified target-pattern occurrences in said images.

13. The method of claim 1, wherein the identified target-pattern occurrences are compared with one being a target and the others being the references.

14. The method of claim 1, wherein said method is executed by a computer program encoded in a computer readable medium.

15. The method of claim 1, wherein:
said images are provided by said computer program instructing an imaging apparatus to form images of said sample substrates; and
said target-pattern occurrences are identified and compared by said computer program instructing an image analyzing apparatus to perform the same, said image analyzing apparatus being electrically coupled with said imaging apparatus for receiving said images from said imaging apparatus.

16. A method for inspecting a substrate, comprising:
identifying a target pattern from an image of said substrate, said target pattern multiply appearing in said image and irregularly distributed;
defining one or more segments to encompass said target-pattern appearances, such that each said target-pattern appearance is encompassed by one of said segments;
defining a segment map to include all of said defined segments; and
comparing said segments in said segment map to identify a presence of defects associated with said target pattern.

17. The method of claim 16, further comprising:
said target pattern appearing two or more times in said image;
identifying another target pattern, said other target pattern appearing two or more times in said image;
defining another segment to encompass said other target pattern, such that each other target-pattern appearance is encompassed by one said other segment;
defining another segment map to include all defined said other segments; and
comparing said other segments in said other segment map to identify the presence of defects associated with said other target pattern.

18. The method of claim 16, wherein at least a portion of said target-pattern appearances are not formed in repetition.

19. The method of claim 16, wherein at least a portion of said target-pattern appearances are irregularly distributed within at least a region on said substrate.

20. The method of claim 16, wherein said image is formed with a charged particle beam imaging apparatus.

* * * * *